(12) United States Patent
Davison et al.

(10) Patent No.: US 7,429,703 B2
(45) Date of Patent: Sep. 30, 2008

(54) METHODS AND APPARATUS FOR INTEGRATED CIRCUIT DEVICE POWER DISTRIBUTION VIA INTERNAL WIRE BONDS

(75) Inventors: Kerry Leeds Davison, Allentown, PA (US); Donald Earl Hawk, Jr., King of Prussia, PA (US); Yehuda Smooha, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 717 days.

(21) Appl. No.: 10/722,652

(22) Filed: Nov. 26, 2003

(65) Prior Publication Data

US 2005/0109525 A1    May 26, 2005

(51) Int. Cl.
*H01R 13/46* (2006.01)
*H05K 5/00* (2006.01)

(52) U.S. Cl. .................. 174/520; 257/784; 257/691

(58) Field of Classification Search ............... 174/52.4, 174/520; 257/691, 784
See application file for complete search history.

(56) References Cited

U.S. PATENT DOCUMENTS

| 5,751,065 A | 5/1998 | Chittipeddi et al. |
| 6,727,597 B2* | 4/2004 | Taylor et al. ............... 257/786 |
| 6,770,963 B1* | 8/2004 | Wu ............................. 257/691 |

* cited by examiner

*Primary Examiner*—Hung V Ngo
(74) *Attorney, Agent, or Firm*—Ryan, Mason & Lewis, LLP

(57) ABSTRACT

An integrated circuit device comprising a die having a top surface with a peripheral region and an interior region surrounded by the peripheral region. Bond pads are disposed in the peripheral region of the die. One or more internal buses are disposed in the interior region of the die. The one or more internal buses distribute power to internal node points of the die. One or more bond wires connect one or more peripheral bond pads with one or more internal buses.

20 Claims, 3 Drawing Sheets

METHODS AND APPARATUS FOR INTEGRATED CIRCUIT DEVICE POWER DISTRIBUTION VIA INTERNAL WIRE BONDS

FIELD OF THE INVENTION

The present invention relates generally to the field of integrated circuits and, more particularly, to power distribution within integrated circuit devices.

BACKGROUND OF THE INVENTION

Although much research and development effort is devoted to aspects of integrated circuit technology such as the devices in the circuit and their operating speeds, other aspects of integrated circuit technology are of equal importance for progress within the field of integrated circuits. Specifically, power distribution through existing integrated circuit devices has hampered further development within the field. For example, due to technological developments, as power consumption increases above several watts in a given device, voltage levels decrease to 1.2 V or lower. It is this power distribution voltage drop in large integrated circuit designs that has become a problem of increasing importance.

In order to improve the power distribution of an integrated circuit device, the current method of power distribution and elements of an integrated circuit device involved in power distribution must first be understood. A positive voltage supply ring and a negative voltage supply ring typically surround the periphery of a die of an integrated circuit device. Positive voltage supply and negative voltage supply connections are made from the positive voltage supply ring and the negative voltage supply ring to bond pads along the periphery of the die via bond wires. These positive voltage supply and negative voltage supply bond pads are typically disposed among those bond pads used to transmit signals from the integrated circuit device to a leadframe, ball grid array package, pin grid array package or other packaging structure. The power must be distributed through internal points of the integrated circuit device from these positive voltage supply and negative voltage supply bond pads along the periphery of the die. It is this distribution or connection that significantly drops the power distribution voltage levels of the integrated circuit device.

Power is routed from the bond pads on the periphery through metal lines in the integrated circuit device. However, due to the fact that these metal lines may not cross over or contact other metal connectors for circuits or other elements of the integrated circuit device, the metal lines may be forced to take longer and more complicated routes to reach the interior area of the integrated circuit device. Further, in order for a sufficient amount of power to be provided to the interior of the integrated circuit device, a metal line or other type of internal bus must be significantly thicker than the ordinary metal connectors. Once power is provided to the interior region of the integrated circuit device, local power interconnects of significantly smaller size may distribute the power to circuit elements. Power distribution voltage drop occurs when there is a high resistivity, thereby reducing the efficiency of the integrated circuit device. The complicated and unnecessarily long routing paths for the power, and the inability to provide a large enough bus to the interior region of the integrated circuit device contribute to the power distribution voltage drop.

Presently, attempts to solve the power distribution voltage drop problem include the utilization of more metal layers in the integrated circuit device. The additional layers may allow for more direct routing of the metal lines and easier access to the interior region of the integrated circuit device. However, the addition of metal layers to the integrated circuit device increases the cost of wafer processing and may not adequately address the problem of power distribution voltage drop, even when utilized to its maximum extent. Integrated circuit devices with more layers have lower reliability since there is a greater possibility of defects. When additional metal layers do not resolve the power distribution voltage drop problem, flip-chip packaging technology has been utilized. However, flip-chip packaging further increases integrated circuit processing cost because it utilizes a solder bumping process and more expensive package substrates.

Further developments in integrated circuit devices are demonstrated in U.S. Pat. No. 5,751,065, entitled "Integrated Circuit with Active Devices Under Bond Pads," which is incorporated herein by reference. Due to conventional bonding technology used to attach wires to bond pads, and to design constraints, bond pads typically have relatively large dimensions as compared to the device dimension and occupy or cover a significant portion of the chip surface. The area underneath the bond pads thus occupies a substantial fraction of the entire chip surface. Techniques disclosed in the above-cited patent allow active circuitry to be placed under bond pads in an integrated circuit having at least three metal layers. The metal layer adjacent the bond pad layer acts as a buffer, provides stress relief, and prevents leakage currents between the bond pad and underlying circuitry. Although the disclosed techniques provide more room for circuitry, they do not directly address the problem of excessive power distribution voltage drop.

Thus, a need exits for techniques that reduce the voltage drop associated with power distribution in an integrated circuit device without significantly increasing integrated circuit device processing cost.

SUMMARY OF THE INVENTION

The present invention provides techniques for power distribution within an integrated circuit device that reduce the voltage drop typically associated with conventional power distribution in such devices.

In accordance with one aspect of the invention, an integrated circuit device comprises a die having a top surface with a peripheral region and an interior region surrounded by the peripheral region. Bond pads are disposed in the peripheral region of the die. One or more internal power buses are disposed in the interior region of the die. The one or more internal buses distribute power to internal node points of the die. One or more bond wires connect one or more of the peripheral bond pads with one or more internal buses.

In accordance with another aspect of the invention, an integrated circuit device is constructed by forming an integrated circuit die having one or more peripheral bond pads and one or more internal buses. The one or more internal buses are configured for distributing power to a plurality of internal node points. The one or more peripheral bond pads are then wire bonded to the one or more internal buses.

The present invention in an illustrative embodiment provides an integrated circuit device in which power is delivered to internal positive voltage supply and negative voltage supply buses on a die, via bond wires attached to bond pads in a peripheral region of the die. The bond wires may originate from the same bond pads used to provide external positive voltage supply and negative voltage supply connections for the die, or they may originate from separate bond pads that are connected to the bond pads used to provide the external positive voltage supply and negative voltage supply connections. These bond wires then connect to internal positive voltage supply and negative voltage supply buses in an interior region of a top surface of the integrated circuit die. Active circuitry may be disposed beneath one or more bond pads associated with the internal buses, so as not to reduce significantly the portion of the die that is utilizable for active circuitry. This wire bond connection from peripheral bond pads to bond pads of the internal buses helps to reduce the overall power distribution voltage drop within the device.

These and other objects, features, and advantages of the present invention will become apparent from the following detailed description of the illustrative embodiments thereof, which is to be read in connection with the accompanying drawings.

DETAILED DESCRIPTION OF THE PREFERRED EMBODIMENTS

As will be illustrated in detail below, the present invention in the illustrative embodiment provides techniques for distributing power and reducing the associated voltage drop through an integrated circuit device by linking internal buses with peripheral bond pads via bond wires.

Figure 1:
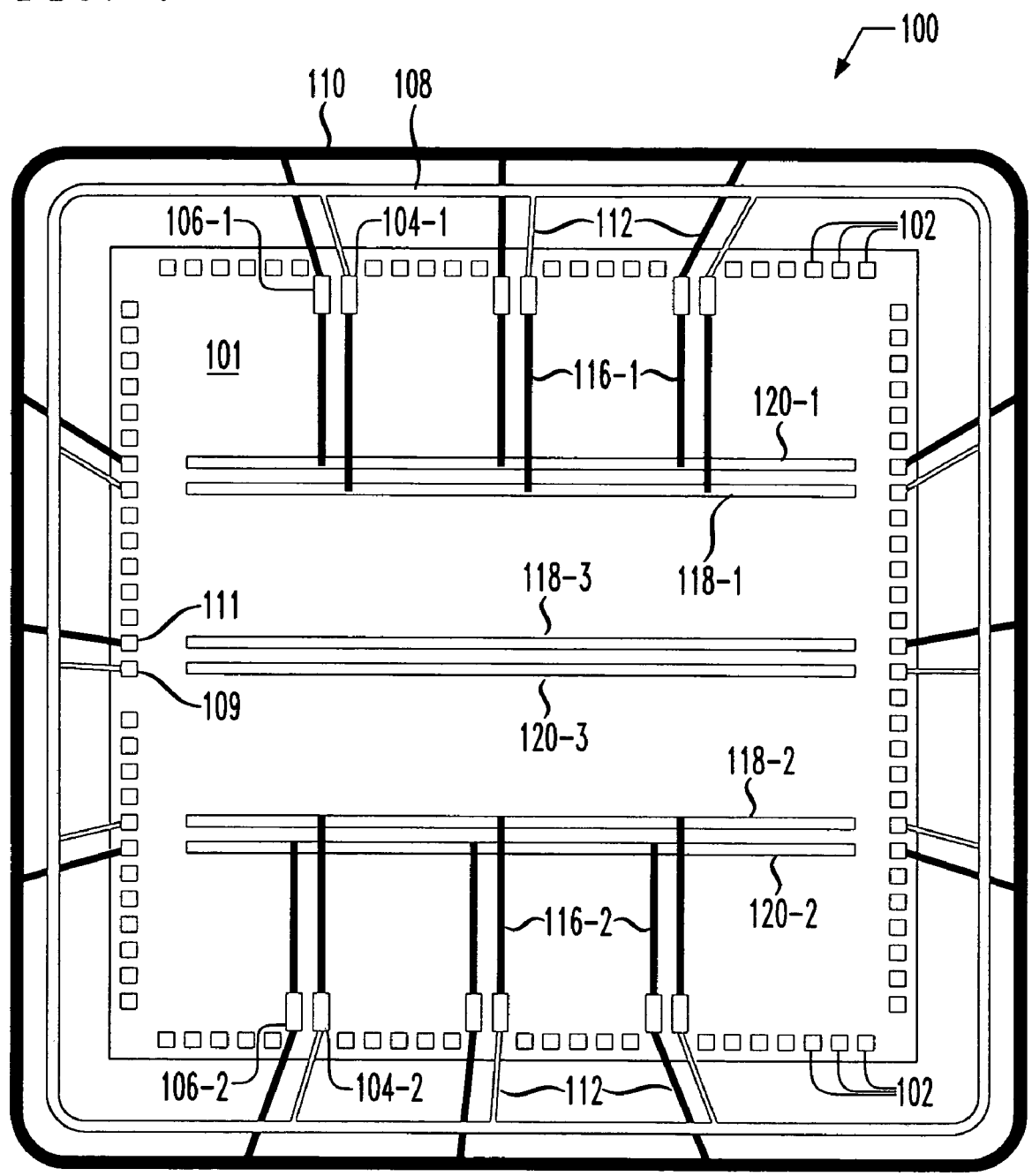
FIG. 1 is a top view of an integrated circuit device illustrating positive voltage supply and negative voltage supply bond pads shared by internal bond wires and external bond wires for power distribution through the integrated circuit device, according to a first embodiment of the present invention.

Referring initially to FIG. 1, an integrated circuit device 100, in accordance with a first illustrative embodiment, comprises a die 101 having a periphery with four sides and an interior area. Bond pads 102 are disposed along the periphery of die 101 and are used in establishing bond wire connections for the transmission of signals from integrated circuit device 100. Positive voltage supply bond pads 104-1, 104-2 and negative voltage supply bond pads 106-1, 106-2 are also disposed along the periphery of die 101. Positive voltage supply bond pads 104-1, 104-2 and negative voltage supply bond pads 106-1, 106-2 may be disposed among bond pads 102. In the embodiment shown in FIG. 1, three positive voltage supply bond pads 104-1, 104-2 and three negative voltage supply bond pads 106-1, 106-2 are evenly spaced in positive/negative voltage supply pairs along each side of die 101. The phrase "positive voltage supply," as used herein is intended to include, for example, a VDD voltage supply, while the phrase "negative voltage supply," as used herein is intended to include, for example, a VSS voltage supply or ground.

A positive voltage supply ring 108 and a negative voltage supply ring 110 surround the periphery of die 101, and act as a power source and sink, respectively, for integrated circuit device 100. Positive and negative voltage supply rings 108, 110 may be incorporated into the support structure for the interface between the chip bond wire and external pins and may take shapes other than that of a ring around the periphery of die 101. Further, positive and negative voltage supply rings 108, 110 are externally connected to positive and negative voltage supply rails (not shown). Positive voltage supply bond pads 104-1, 104-2 are wire bonded to positive voltage supply ring 108 by external bond wires 112. Negative voltage supply bond pads 106-1, 106-2 are wire bonded to negative voltage supply ring 110 by external bond wires 112. External bond wires 112 provide the transmission of power to and from integrated circuit device 100. The number of external bond wires 112 correlates to the total number of positive voltage supply bond pads 104-1, 104-2 and negative voltage supply bond pads 106-1, 106-2 wire bonded to positive voltage supply ring 108 and negative voltage supply ring 110, respectively.

Internal bond wires 116-1, 116-2 connect positive voltage supply bond pads 104-1, 104-2 with internal positive voltage supply buses 118-1, 118-2 of an internal power distribution grid. This internal power distribution grid may be in the form of or part of a metal grid. Such a metal grid is an example of what is more generally referred to herein as an "internal bus" that distributes power to internal node points of an integrated circuit device. Internal bond wires 116-1, 116-2 also connect negative voltage supply bond pad 106-1, 106-2 with internal negative voltage supply buses 120-1, 120-2 of an internal metal grid. Therefore, in the embodiment shown in FIG. 1, positive voltage supply bond pads 104-1, 104-2 may be shared by external bond wires 112 and internal bond wires 116-1, 116-2. Further, negative voltage supply bond pads 106-1, 106-2 may be shared by external bond wire 112 and internal bond wires 116-1, 116-2.

Not all positive voltage supply bond pads and negative voltage supply bond pads must be wire bonded to the internal metal grid. As shown in the embodiment illustrated in FIG. 1, it is possible to have a positive voltage supply bond pad 109 and a negative voltage supply bond pad 111 that are connected to positive voltage supply bus 118-3 and negative voltage supply bus 120-3, respectively, through the traditional means, although such a connection is not explicitly shown in the figure. Other positive voltage supply bond pads 104-1, 104-2 and negative voltage supply bond pads 106-1, 106-2 are linked to the metal grid through internal bond wires 116-1, 116-2. In this embodiment, positive voltage supply and negative voltage supply pads on only two of the four sides of die 101 are connected to internal bond wires 116.

Further, as illustrated in FIG. 1, internal positive voltage supply buses and internal negative voltage supply buses may be disposed on die 101 in three sets of parallel pairs. Internal positive voltage supply bus 118-1 and internal negative voltage supply bus 120-1 extend parallel to a side of die 101 having positive voltage supply bond pads 104-1 and negative voltage supply bond pads 106-1, to which internal positive voltage supply bus 118-1 and internal negative voltage supply bus 120-1, respectively, are wire bonded. Internal positive voltage supply bus 118-3 and internal negative voltage supply bus 120-3 extend parallel to internal positive voltage supply bus 118-1 and internal negative voltage supply bus 120-1 across the middle of die 101 without wire bond connections. Finally, internal positive voltage supply bus 118-2 and internal negative voltage supply bus 120-2 extend parallel to a side of die 101 opposite that of internal positive voltage supply bus 118-1 and internal negative voltage supply bus 120-1, and are wire bonded to positive voltage supply bond pads 104-2 and negative voltage supply bond pads 106-2, respectively, disposed on that side.

Therefore, in the embodiment of the present invention shown in FIG. 1, internal bond wires 116-1, 116-2 transmit power to and from the internal metal grid. The use of internal bond wires 116-1, 116-2 provides an inexpensive means to distribute power to the metal grid while reducing the associated voltage drop. This embodiment illustrates three positive voltage supply wire bond connections to internal positive voltage supply buses 118-1, 118-2 and three negative voltage supply wire bond connections to internal negative voltage supply buses 120-1, 120-2. Internal positive voltage supply bus 118-1, 118-2 and internal negative voltage supply bus 120-1, 120-2 of the internal metal grid then may distribute power to and from internal nodes of integrated circuit device 100. The internal nodes of integrated circuit device 100 may be in the form of circuits or other elements, and power may be provided to these elements through local power interconnects.

Internal bond wires 116-1, 116-2 may be bonded to bond pads on internal positive voltage supply bus 118-1, 118-2 and internal negative voltage supply bus 120-1, 120-2 with active circuitry being disposed under these bond pads. Thus, the bonding areas of internal positive voltage supply bus 118-1, 118-2 and internal negative voltage supply bus 120-1, 120-2 can be configured so as not to reduce significantly the portion of die 101 that is utilizable for active circuitry. A plurality of patterned metal layers may exist between the bond pads and the semiconductor layer with the active devices. The metal layer nearest the bond pads shields and protects the devices from the stress produced during the bonding process. The electrical connections between bond pads and the active circuitry are made through windows in the dielectric layers, between the bond pads and the active devices, which expose portions of the active circuitry and are filled with metal. In a preferred embodiment there are at least three metal layers.

Figure 2:
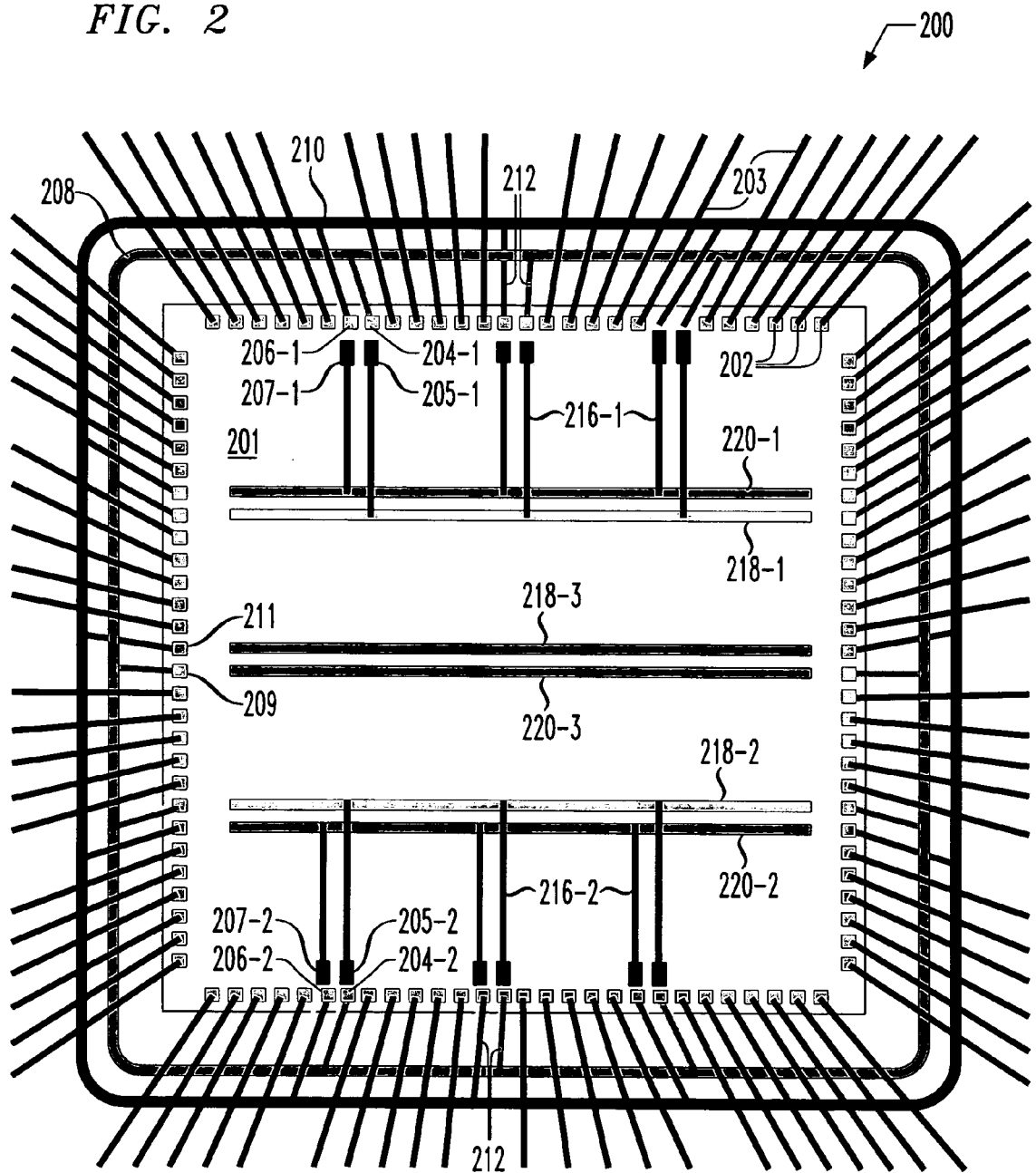
FIG. 2 is a top view of an integrated circuit device illustrating positive voltage supply and negative voltage supply bond pads for external bond wires and additional positive voltage supply and negative voltage supply bond pads for internal bond wires for power distribution through the integrated circuit device, according to a second embodiment of the present invention.

Referring now to FIG. 2, an integrated circuit device 200, in accordance with a second illustrative embodiment, comprises a die 201 having a periphery with four sides and an interior area. Bond pads 202 are disposed along the periphery of die 201. Further, bond wires 203 are bonded to bond pads 202 so that they may be utilized in sending signals to or from integrated circuit device 200 via a leadframe, ball grid array package, pin grid array package or other packaging structure. Positive voltage supply bond pads 204-1, 204-2 and negative voltage supply bond pads 206-1, 206-2 are also disposed along the periphery of die 201 among bond pads 202, in a manner similar to that illustrated in FIG. 1.

Positive voltage supply bond pads 204-1, 204-2 are wire bonded to positive voltage supply ring 208 by external bond wires 212. Negative voltage supply bond pads 206-1, 206-2 are wire bonded to negative voltage supply ring 210 by external bond wires 212. The embodiment of FIG. 2 illustrates additional positive voltage supply bond pads 205-1, 205-2 disposed adjacent to each positive voltage supply bond pad 204-1, 204-2. Additional negative voltage supply bond pads 207-1, 207-2 are disposed adjacent to each negative voltage supply bond pad 206-1, 206-2. Additional positive voltage supply bond pads 205-1, 205-2 are connected to positive voltage supply bond pads 204-1, 204-2 through a metal trace or other interconnect of integrated circuit device 200, not specifically shown in the figure, thereby allowing power to flow from bond pad to bond pad. Additional negative voltage supply bond pads 207-1, 207-2 are connected to negative voltage supply bond pads 206-1, 206-2 in the same fashion. Internal bond wires 216-1, 216-2 connect additional positive voltage supply bond pads 205-1, 205-2 with internal positive voltage supply buses 218-1, 218-2 of an internal metal grid. Internal bond wires 216-1, 216-2 also connect additional negative voltage supply bond pads 207-1, 207-2 with internal negative voltage supply buses 220-1, 220-2 of an internal metal grid. Therefore, FIG. 2 illustrates an embodiment in which additional bond pads 205-1, 205-2, 207-1, 207-2, provide connections for internal bond wires 216-1, 216-2, while bond pads 204-1, 204-2, 206-1, 206-2 provide connections for external bond wires 212.

In the embodiment illustrated in FIG. 2, it is possible to have a positive voltage supply bond pad and a negative voltage supply bond pad that are connected to internal positive voltage supply bus 218-3 and internal negative voltage supply bus 220-3 of integrated circuit device 200 through the traditional means, not shown in the figure. Other positive voltage supply bond pads 204-1, 204-2 and negative voltage supply bond pads 206-1, 206-2 are linked to additional positive voltage supply bond pads 205-1, 205-2 and additional negative voltage supply bond pads 207-1, 207-2 and the metal grid through internal bond wires 216-1, 216-2. Only positive voltage supply and negative voltage supply pads on two of the four sides of die 101 are connected by internal bond wires 216.

In FIGS. 1 and 2 power is received at a peripheral region of a top surface of a die of an integrated circuit device from an external power connection. The external power connection may be through a positive voltage supply ring and a negative voltage supply ring that supplies power through bond wires to bond pads on the periphery of the integrated circuit device. The power is supplied from the peripheral region to internal buses within the periphery of the die of the integrated circuit device through bond wires. Power is then distributed from the internal buses to circuit elements or other internal node points of the integrated circuit device.

Figure 3:
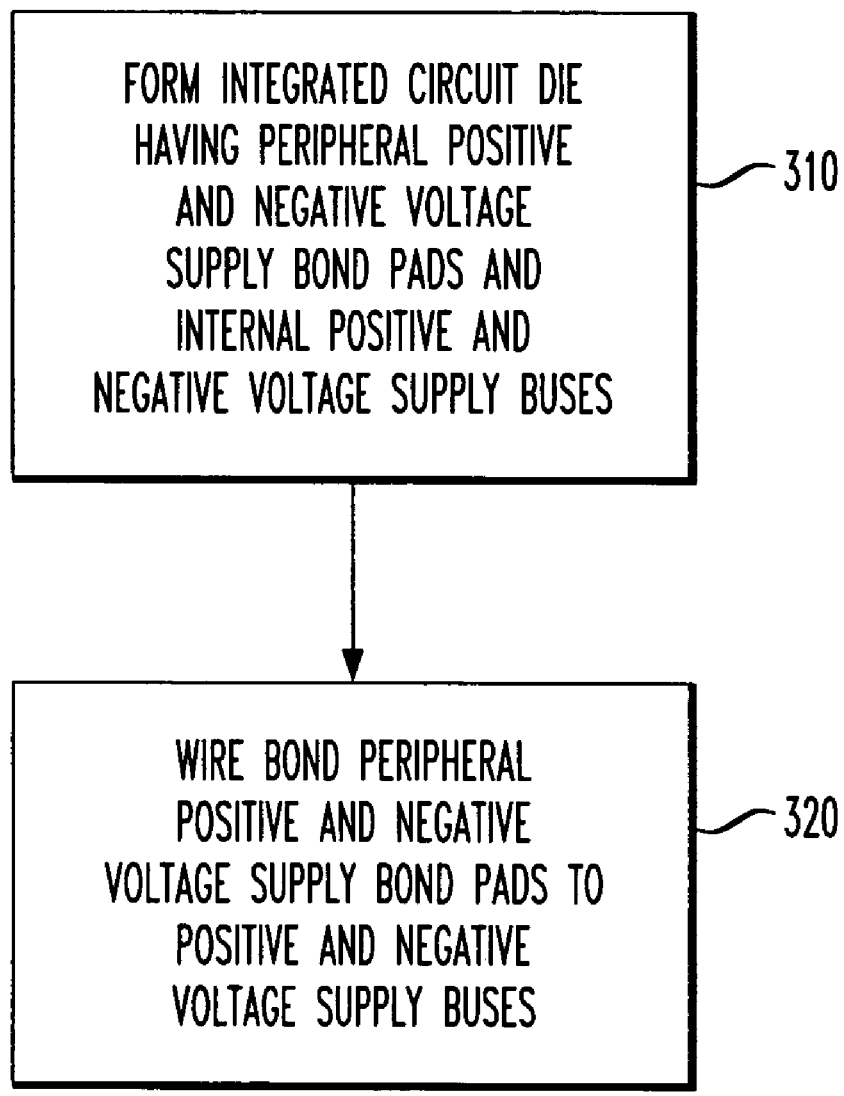
FIG. 3 is a flow diagram illustrating an integrated circuit device construction methodology utilizing internal wire bonds for power distribution, according to an embodiment of the present invention.

Referring now to FIG. 3, a flow diagram illustrates an integrated circuit device construction methodology utilizing internal wire bonds for power distribution, according to an embodiment of the present invention. In step 310, an integrated circuit die is formed having peripheral positive voltage supply and negative voltage supply bond pads and internal positive voltage supply and negative voltage supply buses. In step 320, peripheral positive voltage supply and negative voltage supply bond pads are wire bonded to the positive voltage supply and negative voltage supply buses, respectively.

Accordingly, as described herein, the present invention in the illustrative embodiment provides power distribution through an integrated circuit device and, more particularly, power distribution via bond wires from a periphery of a die of the integrated circuit device to an internal metal grid or other internal power distribution bus of the integrated circuit device.

Advantageously, the present invention in the illustrative embodiments provides techniques for distributing power through an integrated circuit device in which bond wires are utilized for connecting the positive voltage supply and negative voltage supply from the periphery to internal buses. Wire bonding is a relatively inexpensive process that allows for sufficient transmission of power to interior regions of the die of the integrated circuit device without increasing the number of metal layers. Further, bond wires provide lower resistivity than traditional metal lines. Thus, the use of internal wire bonding as disclosed herein substantially reduces the power distribution voltage drop that normally occurs in metal lines routed from the bond pads to the internal buses of the integrated circuit device.

Additional embodiments of the present invention may utilize different numbers and configurations of the positive voltage supply and negative voltage supply bond pads. Further, the integrated circuit device may take on a variety of different sizes or shapes, and all sides need not be of substantially equal length. The particular distribution paths of the internal positive voltage supply and negative voltage supply buses may vary, but may correlate generally to the shape of the die and the integrated circuit device, as well as the placement of the positive voltage supply and negative voltage supply bond pads on the periphery of the die. The number and configuration of the internal buses may also vary. The internal buses may also be configured without active circuitry being disposed underneath the associated bond pads. Finally, the number of wire bonds from the periphery of the integrated circuit device to the internal buses may vary depending on the power requirements and the number of bond pads and internal buses.

Therefore, although illustrative embodiments of the present invention have been described herein with reference to the accompanying drawings, it is to be understood that the invention is not limited to those precise embodiments, and that various other changes and modification may be made by one skilled in the art without departing from the scope or spirit of the invention.

What is claimed is:

1. An integrated circuit device comprising:
   a die having a top surface with a peripheral region and an interior region surrounded by the peripheral region:
   a plurality of bond pads disposed in the peripheral region of the die;
   at least one internal bus, disposed in the interior region of the die, that distributes power to a plurality of internal node points of the die; and
   at least one bond wire connecting at least one of the plurality of bond pads with the at least one internal bus;
   wherein the at least one internal bus further comprises at least three separate parallel pairs of internal buses;
   a first one of the pairs of internal buses being arranged adjacent and parallel to a first side of the peripheral region;
   a second one of the pairs of internal buses being arranged adjacent and parallel to a second side of the peripheral region opposite the first side of the peripheral region; and
   a third one of the pairs of internal buses being disposed between and parallel to the first and second pairs.

2. The integrated circuit device of claim 1, wherein the at least one internal bus comprises a metal power grid.

3. The integrated circuit device of claim 1, wherein the at least one internal bus comprises at least one internal positive voltage supply bus.

4. The integrated circuit device of claim 1, wherein the at least one internal bus comprises at least one internal negative voltage supply bus.

5. The integrated circuit device of claim 1, wherein the at least one internal bus comprises at least one pair of buses comprising an internal positive voltage supply bus and internal negative voltage supply bus.

6. The integrated circuit device of claim 5, wherein at least one of the voltage supply buses comprises a ground bus.

7. The integrated circuit device of claim 1, wherein the at least one internal bus comprises bond pads having active circuitry disposed thereunder.

8. The integrated circuit device of claim 1, wherein at least one of the plurality of bond pads is wire bonded to an integrated circuit package.

9. The integrated circuit device of claim 1, wherein the at least one of the plurality of bond pads wire bonded to the at least one internal bus is also wire bonded via another bond wire to a positive voltage supply terminal of the device.

10. The integrated circuit device of claim 9, wherein the positive voltage supply terminal comprises a positive voltage supply ring substantially surrounding the die.

11. The integrated circuit device of claim 1, wherein the at least one of the plurality of bond pads wire bonded to the at least one internal bus is also wire bonded via another bond wire to a negative voltage supply terminal of the device.

12. The integrated circuit device of claim 11, wherein the negative voltage supply terminal comprises a negative voltage supply ring substantially surrounding the die.

13. The integrated circuit device of claim 1, wherein the at least one of the plurality of bond pads wire bonded to the at least one internal bus is connected to another of the plurality of bond pads.

14. The integrated circuit device of claim 1, further comprising local power interconnects that distribute power from the at least one internal bus to the plurality of internal node points.

15. The integrated circuit device of claim 1, wherein the plurality of internal node points comprise circuit elements.

16. The integrated circuit device of claim 1, wherein the power is distributed from the at least one of the plurality of bond pads to at least one secondary bond pad through a metal connector, and from the at least one secondary bond pad to the at least one internal bus through at least one wire bond connection within the peripheral region of the die.

17. The integrated circuit device of claim 1, wherein the at least one of the plurality of bond pads comprises at least one pair of bond pads comprising a positive voltage supply bond pad and a negative voltage supply bond pad.

18. The integrated circuit device of claim 17, wherein the at least one pair of bond pads comprises at least about twelve pairs of bond pads substantially evenly spaced apart in the peripheral region of the die.

19. A method of constructing an integrated circuit device comprising the following steps:
   forming an integrated circuit die having at least one peripheral bond pad and at least one internal bus, the internal bus being configured for distributing power to a plurality of internal node points of the integrated circuit device; and
   wire bonding the at least one peripheral bond pad to the at least one internal bus;
   wherein the at least one internal bus further comprises at least three separate parallel pairs of internal buses;
   a first one of the pairs of internal buses being arranged adjacent and parallel to a first side of the die;
   a second one of the pairs of internal buses being arranged adjacent and parallel to a second side of the die opposite the first side of the die; and
   a third one of the pairs of internal buses being disposed between and parallel to the first and second pairs.

20. A die configured for use in an integrated circuit device, the die having a top surface with a peripheral region and an interior region surrounded by the peripheral region, the die comprising:
   a plurality of bond pads disposed in the peripheral region of the die; and
   at least one internal bus, disposed in the interior region of the die, that distributes power to a plurality of internal node points of the die;

wherein the plurality of bond pads and the at least one internal bus are connected by at least one bond wire;

wherein the at least one internal bus further comprises at least three separate parallel pairs of internal buses;

a first one of the pairs of internal buses being arranged adjacent and parallel to a first side of the peripheral region;

a second one of the pairs of internal buses being arranged adjacent and parallel to a second side of the peripheral region opposite the first side of the peripheral region; and a third one of the pairs of internal buses being disposed between and parallel to the first and second pairs.

* * * * *